United States Patent
Xu

(10) Patent No.: US 11,744,117 B2
(45) Date of Patent: *Aug. 29, 2023

(54) LIGHT EMITTING DEVICE AND METHOD FOR MANUFACTURING THE SAME, AND DISPLAY DEVICE

(71) Applicant: BOE TECHNOLOGY GROUP CO., LTD., Beijing (CN)

(72) Inventor: Jian Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 126 days.

This patent is subject to a terminal disclaimer.

(21) Appl. No.: 17/399,848

(22) Filed: Aug. 11, 2021

(65) Prior Publication Data
US 2021/0376022 A1    Dec. 2, 2021

Related U.S. Application Data

(63) Continuation of application No. 16/337,618, filed as application No. PCT/CN2018/113390 on Nov. 1, 2018, now Pat. No. 11,127,800.

(30) Foreign Application Priority Data

Mar. 27, 2018  (CN) .......................... 201820418243.0

(51) Int. Cl.
  *H10K 59/122*    (2023.01)
  *H10K 50/15*     (2023.01)
  (Continued)

(52) U.S. Cl.
  CPC .......... *H10K 59/122* (2023.02); *H10K 50/15* (2023.02); *H10K 50/16* (2023.02); *H10K 50/171* (2023.02);
  (Continued)

(58) Field of Classification Search
  CPC ...... H10K 59/122; H10K 50/15; H10K 50/16; H10K 50/171; H10K 59/121;
  (Continued)

(56) References Cited

U.S. PATENT DOCUMENTS 6,366,025 B1  4/2002  Yamada
9,331,127 B2  5/2016  Kim et al.
(Continued)

FOREIGN PATENT DOCUMENTS

CN  102456714 A  5/2012
CN  106298847 A  1/2017
(Continued)

*Primary Examiner* — Kyoung Lee
*Assistant Examiner* — Christina A Sylvia
(74) *Attorney, Agent, or Firm* — The Webb Law Firm

(57) ABSTRACT

The present disclosure provides a light emitting device and a method for manufacturing the same, and a display device, and relates to the technical field of display. The light emitting device includes: a pixel define layer; a plurality of sub-pixels, comprising a first sub-pixel and a second sub-pixel adjacent to and spaced apart from the first sub-pixel by the pixel define layer, wherein each of the plurality of sub-pixels comprises a functional layer; and a blocking member disposed on the pixel define layer.

6 Claims, 4 Drawing Sheets

(51) Int. Cl.
*H10K 50/16* (2023.01)
*H10K 50/17* (2023.01)
*H10K 59/35* (2023.01)
*H10K 59/121* (2023.01)
*H10K 71/00* (2023.01)

(52) U.S. Cl.
CPC ....... *H10K 59/121* (2023.02); *H10K 59/1213* (2023.02); *H10K 59/35* (2023.02); *H10K 59/353* (2023.02); *H10K 71/00* (2023.02)

(58) Field of Classification Search
CPC .. H10K 59/1213; H10K 59/353; H10K 71/00; H01L 27/3211; H01L 27/3216; H01L 27/3218; H01L 27/3246; H01L 51/52
See application file for complete search history.

(56) References Cited

U.S. PATENT DOCUMENTS

| | | |
|---|---|---|
| 2004/0105710 A1 | 6/2004 | Shakuto et al. |
| 2009/0009069 A1* | 1/2009 | Takata ................ H01L 27/3246 445/24 |
| 2010/0200869 A1 | 8/2010 | Sekiya |
| 2012/0112172 A1 | 5/2012 | Kashiwabara |
| 2014/0183484 A1 | 7/2014 | Moon |
| 2014/0361260 A1* | 12/2014 | Kim ..................... H01L 27/3246 438/23 |
| 2015/0372063 A1* | 12/2015 | Lee ..................... H01L 27/3246 257/40 |
| 2016/0155785 A1 | 6/2016 | Sato |
| 2016/0380035 A1* | 12/2016 | Cho .................... H01L 51/5088 257/40 |
| 2021/0193946 A1* | 6/2021 | Zhang .................... H01L 51/56 |

FOREIGN PATENT DOCUMENTS

| | | |
|---|---|---|
| CN | 107546335 A | 1/2018 |
| JP | 2001290441 A | 10/2001 |
| JP | 2004117438 A | 4/2004 |
| JP | 2011060435 A | 3/2011 |
| JP | 201196376 A | 5/2011 |
| JP | 2016103395 A | 6/2016 |
| JP | 2016126860 A | 7/2016 |

\* cited by examiner

```
form a pixel define layer on an initial
 substrate structure, the pixel define
   layer is formed with a plurality of
 openings exposing the initial substrate
                structure
```
— S520

```
form functional layers for a plurality of
  sub-pixels in the plurality of openings,
    and forming a blocking member on the
             pixel define layer
```
— S540

LIGHT EMITTING DEVICE AND METHOD FOR MANUFACTURING THE SAME, AND DISPLAY DEVICE

CROSS-REFERENCE TO RELATED APPLICATIONS

The present application is a Continuation Application of U.S. patent application Ser. No. 16/337,618, which is the U.S. National Stage Application under 35 U.S.C. § 371 of International Patent Application No. PCT/CN2018/113390, filed on Nov. 1, 2018, which claims priority to China Patent Application 201820418243.0, filed on Mar. 27, 2018, the disclosures of each of which are incorporated by reference herein in entirety.

TECHNICAL FIELD

The present disclosure relates to the technical field of display, and particularly to a light emitting device and a method for manufacturing the same, and a display device.

BACKGROUND

In an OLED (Organic Light Emitting Diode) device of the related art, when the materials of light emitting layers of sub-pixels with a plurality of colors are formed by a FMM (Fine Metal Mask) process, respectively, an organic layer corresponding to a color needs to be vapor-deposited in each sub-pixel. A boundary of a sub-pixel light emitting area is defined by a Pixel Define Layer (PDL) to form a sub-pixel well. An organic layer is filled in the sub-pixel well. But light each sub-pixel emits can still be transmitted within the material of the PDL.

At present, the PPI (pixels per inch) of small-sized products is getting higher and higher, and the space between sub-pixels is getting smaller and smaller, but the brightness is required to be higher and higher. In an OLED device, the light each sub-pixel emits is mainly in a direction perpendicular to a surface of the sub-pixel.

SUMMARY

According to one aspect of embodiments of the present disclosure, a light emitting device is provided. The light emitting device comprises: a pixel define layer; a plurality of sub-pixels, comprising a first sub-pixel and a second sub-pixel adjacent to and spaced apart from the first sub-pixel by the pixel define layer, wherein each of the plurality of the sub-pixels comprises a functional layer; and a blocking member disposed on the pixel define layer.

In some embodiments, the blocking member comprises a first component and a second component stacked on the pixel define layer, wherein a material of the first component is the same as that of at least a part of the functional layer of the first sub-pixel, and a material of the second component is the same as that of at least a part of the functional layer of the second sub-pixel.

In some embodiments, the functional layer comprises a light emitting layer.

In some embodiments, the functional layer further comprises a first carrier transport layer and a second carrier transport layer therebetween the light emitting layer being located; the first component and the second component each comprises a part of a same material as that of the first carrier transport layer, and the part of the same material as that of the first carrier transport layer of the first component is spaced apart from the part of the same material as that of the first carrier transport layer of the second component.

In some embodiments, the first component comprises three parts of a same material as that of the first carrier transport layer, the second carrier transport layer, and the light emitting layer of the first sub-pixel, respectively; the second component comprises three parts of a same material as that of the first carrier transport layer, the second carrier transport layer, and the light emitting layer of the second sub-pixel, respectively.

In some embodiments, the blocking member comprises an insulating layer.

In some embodiments, a slope angle $\theta$ formed by the blocking member on the pixel define layer ranges from $1° < \theta < 60°$.

In some embodiments, the first component is a part of the functional layer of the first sub-pixel extending above the pixel define layer, and the second component is a part of the functional layer of the second sub-pixel extending above the pixel define layer.

In some embodiments, in a case where the second component covers the first component: the first sub-pixel is a red sub-pixel, and the second sub-pixel is a green sub-pixel or a blue sub-pixel; or the first sub-pixel is a green sub-pixel, and the second sub-pixel is a blue sub-pixel.

In some embodiments, in the plurality of sub-pixels: a sum of areas of the functional layer of the blue sub-pixel and the part of the functional layer of the blue sub-pixel extending above the pixel define layer is greater than that of the functional layer of the red sub-pixel and the part of the functional layer of the red sub-pixel extending above the pixel define layer, and a sum of areas of the functional layer of the red sub-pixel and the part of the functional layer of the red sub-pixel extending above the pixel define layer is greater than that of the functional layer of the green sub-pixel and the part of the functional layer of the green sub-pixel extending above the pixel define layer.

In some embodiments, in a case where the first sub-pixel is a red sub-pixel and the second sub-pixel is a green sub-pixel, the blocking member has a thickness ranging from 500 Å to 3500 Å; in a case where the first sub-pixel is a green sub-pixel, and the second sub-pixel is a blue sub-pixel, the blocking member has a thickness ranging from 400 Å to 2700 Å; or in a case where the first sub-pixel is a red sub-pixel, and the second sub-pixel is a blue sub-pixel, the blocking member has a thickness ranging from 400 Å to 2700 Å.

According to another aspect of embodiments of the present disclosure, a light emitting device is provided. The light emitting device comprises: a plurality of drive transistors, each of the plurality of drive transistors comprising a first electrode; a substrate located on one side of the plurality of drive transistors; a plurality of organic light emitting diodes located on the other side of the plurality of drive transistors opposite to the substrate, comprising at least a first organic light emitting diode and a second organic light emitting diode adjacent to and spaced apart from the first organic light emitting diode by a pixel define layer, wherein: each of the plurality of organic light emitting diodes comprises a second electrode electrically connected to the first electrode, a third electrode, and a functional layer at least a part of which being located between the second electrode and the third electrode, and the functional layer comprises at least a light emitting layer, an area of a surface of the light emitting layer away from the substrate is greater than that of a surface of the second electrode away from the substrate; and a blocking member located on a side of the pixel define layer away from the substrate, wherein a projection of the blocking member on the substrate is spaced apart from a projection of the second electrode on the substrate, and the blocking member comprises a part of a same material as that of the functional layer.

In some embodiments, the first electrode is a source electrode; each of the plurality of drive transistors further comprises a gate electrode, a drain electrode, and a semiconductor layer, wherein a projection of the semiconductor layer on the substrate is located within a projection of the second electrode on the substrate.

In some embodiments, the functional layer further comprises a hole transport layer and an electron transport layer, wherein an area of a surface of the hole transport layer away from the substrate and an area of a surface of the electron transport layer away from the substrate each is greater than that of a surface of the second electrode away from the substrate.

In some embodiments, a slope angle θ formed by the blocking member on the pixel define layer ranges from 1°<θ<60°.

In some embodiments, the blocking member comprises a first component and a second component stacked on the pixel define layer, wherein a material of the first component is the same as that of at least a part of the functional layer of the first organic light emitting diode, and a material of the second component is the same as that of at least a part of the functional layer of the second organic light emitting diode.

In some embodiments, the first component is a part of the functional layer of the first organic light emitting diode extending above the pixel define layer, and the second component is a part of the functional layer of the second organic light emitting diode extending above the pixel define layer.

In some embodiments, in a case where the second component covers the first component: the first organic light emitting diode is a red organic light emitting diode, and the second organic light emitting diode is a green organic light emitting diode or a blue organic light emitting diode; or the first organic light emitting diode is a green organic light emitting diode, and the second organic light emitting diode is a blue organic light emitting diode.

In some embodiments, in a case where the first organic light emitting diode is a red organic light emitting diode and the second organic light emitting diode is a green organic light emitting diode, the blocking member has a thickness ranging from 500 Å to 3500 Å; in a case where the first organic light emitting diode is a green organic light emitting diode, and the second organic light emitting diode is a blue organic light emitting diode, the blocking member has a thickness ranging from 400 Å to 2700 Å; or in a case where the first organic light emitting diode is a red organic light emitting diode, and the second organic light emitting diode is a blue organic light emitting diode, the blocking member has a thickness ranging from 400 Å to 2700 Å.

According to still another aspect of embodiments of the present disclosure, a display device is provided. The display device comprises the light emitting device according to any one of the above embodiments.

According to still another aspect of embodiments of the present disclosure, a method for manufacturing a light emitting device is provided. The method comprises: forming a pixel define layer on an initial substrate structure, wherein the pixel define layer is formed with a plurality of openings exposing the initial substrate structure; and forming functional layers for a plurality of sub-pixels in the plurality of openings, and forming a blocking member on the pixel define layer.

In some embodiments, in a case where a material of the blocking member is the same as that of at least a part of the functional layers, the blocking member is formed during formation of the functional layers.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be understood more clearly from the following detailed description with reference to the accompanying drawings, in which.

Figure 1:
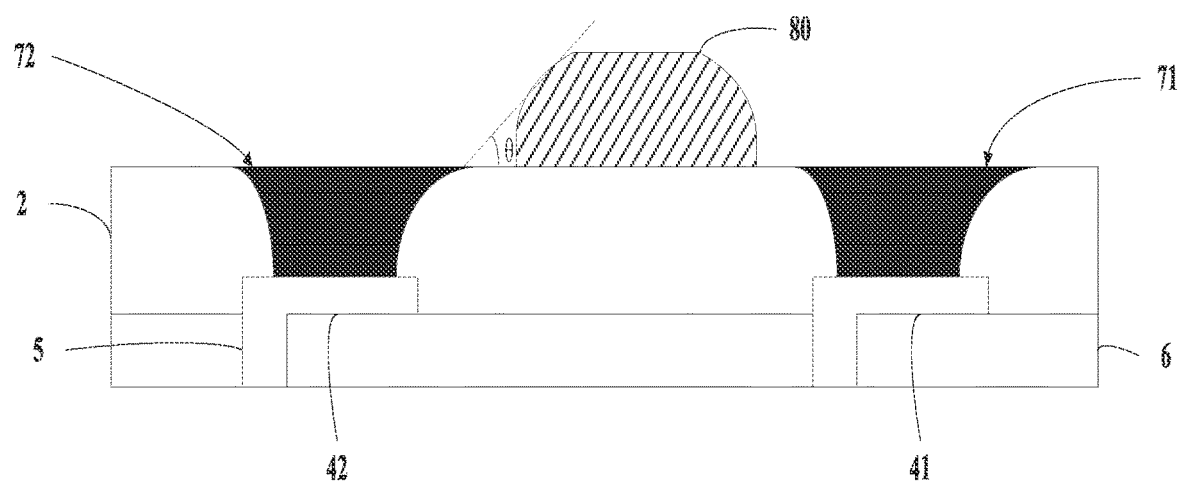
FIG. 1 is a schematic sectional view schematically showing a light emitting device according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (comprising technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors of the present disclosure have found that a part of the light each sub-pixel emits is emitted in a direction inclined to a surface of the sub-pixel, which causes a phenomenon of light mixing between adjacent sub-pixels of different colors, and results in poor color gamut and reduced visual effect.

In view of this, embodiments of the present disclosure provide a light emitting device to alleviate a light mixing phenomenon between adjacent sub-pixels. A light emitting device according to some embodiments of the present disclosure will be described below in detail with reference to the accompanying drawings. FIG. 1 is a schematic sectional view schematically showing a light emitting device according to an embodiment of the present disclosure.

As shown in FIG. 1, the light emitting device may comprise a pixel define layer 2, a plurality of sub-pixels, and a blocking member 80. The plurality of sub-pixels comprise a first sub-pixel 71 and a second sub-pixel 72 adjacent to the first sub-pixel 71 and spaced apart from the first sub-pixel 71 by the pixel define layer 2. Each sub-pixel may comprise a functional layer. The blocking member 80 may be disposed on the pixel define layer 2. In addition, FIG. 1 also shows an anode (comprising a first anode 41 for a first sub-pixel and a second anode 42 for a second sub-pixel), a via 5, and a spacer insulating layer 6 between the anode and a backplane circuit (not shown in FIG. 1). The via 5 is a via, in which a conductive material layer (for example, a metal layer) is disposed, formed through the spacer insulating layer 6. The anode is conducted to the backplane circuit through the conductive material layer in the via 5. It should be noted that although the anode and the conductive material layer in the via 5 shown in FIG. 1 are integrally formed, the scope of the embodiments of the present disclosure is not limited thereto. The anode and the conductive material layer in the via may be separately formed. For example, the anode and the conductive material layer in the via can be structures of different materials.

In the light emitting device of this embodiment, a blocking member is disposed on the pixel define layer. The blocking member can block lights emitted by the first sub-pixel and the second sub-pixel, respectively, from emitting and mixing above the pixel define layer as much as possible. In this way, the light mixing phenomenon between adjacent first sub-pixel and second sub-pixel can be alleviated, and the display effect of the light emitting device is improved.

In some embodiments, as shown in FIG. 1, a slope angle θ formed by the blocking member 80 on the pixel define layer may range from $1°<θ<60°$. For example, the slope angle θ may be 10°, 20°, 30°, or 50°. Here, the slope angle may be an angle between a slope of the blocking member and an upper surface of the pixel define layer. In this embodiment, the above slope angle can be set to be in appropriate range to alleviate the light mixing phenomenon between adjacent sub-pixels as much as possible and prevent light normally emitted by the sub-pixels from blocking as much as possible. It should be noted that the range of the slope angle θ of the embodiments of the present disclosure is not limited thereto and the slope angle θ can be set to other angles as needed by those skilled in the art.

In some embodiments, the blocking member 80 may comprise an insulating layer. For example, the insulating layer may comprise at least one of silicon dioxide or silicon nitride. In this embodiment, an embodiment in which an insulating layer is used as a blocking member on the pixel define layer is described. However, implementations of the embodiments of the present disclosure are not limited thereto. Embodiments of the present disclosure may also comprise an embodiment in which a blocking member is formed with a structural layer of the same material as that of the functional layer of the sub-pixel.

In some embodiments, the blocking member may comprise a first component and a second component. A material of the first component is the same as that of at least a part of the functional layer of the first sub-pixel. A material of the second component is the same as that of at least a part of the functional layer of the second sub-pixel. The first component and the second component are stacked on the pixel define layer. In this embodiment, a structural layer of the same material as that of at least a part of the functional layers of adjacent two sub-pixels is utilized as a blocking member. No other material layer needs to be introduced during the manufacturing process, which makes the manufacturing process easier to implement.

In some embodiments, the first component of the blocking member may be a part of the functional layer of the first sub-pixel extending above the pixel define layer, and the second component of the blocking member may be a part of the functional layer of the second sub-pixel extending above the pixel define layer. For example, a functional layer of each sub-pixel may extend above the pixel define layer. The adjacent first sub-pixel and second sub-pixel each has a part of functional layer overlapping on the pixel define layer to form an overlapping part. This overlapping part can serve as a blocking member. Of course, the scope of the embodiments of the present disclosure is not limited to the extending situation described herein. For example, during the manufacturing process, the functional layers of the overlapping part may be spaced apart from the functional layers of the respective sub-pixels, respectively.

In some embodiments, the functional layer may comprise a light emitting layer. For example, the first component of the blocking member may comprise a part of the same material as that of the light emitting layer of the first sub-pixel, and the second component of the blocking member may comprise a part of the same material as that of the light emitting layer of the second sub-pixel.

In other embodiments, the functional layer further comprises a first carrier transport layer and a second carrier transport layer. The light emitting layer is located between the first carrier transport layer and the second carrier transport layer. The first component and the second component of the blocking member each comprises a part of a same material as that of the first carrier transport layer, and the part of the same material as that of the first carrier transport layer of the first component is spaced apart from the part of the same material as that of the first carrier transport layer of the second component.

For example, the first carrier transport layer comprises an Electron Transport Layer (ETL), and the second carrier transport layer comprises a Hole Transport Layer (HTL). For another example, the first carrier transport layer comprises the hole transport layer, and the second carrier transport layer comprises the electron transport layer. For example, the electron transport layer, the hole transport layer, and the light emitting layer may each be an organic layer. It should be noted that the functional layer may further comprise other organic layers or inorganic layers other than at least one of the electron transport layer, the hole transport layer, or the light emitting layer. For example, the functional layer may comprise an electron blocking layer or a hole blocking layer or the like. Therefore, the scope of the embodiments of the present disclosure is not limited to the examples of the functional layers described herein.

In some embodiments, the first component of the blocking member may comprise a part of a same material as that of at least one of the electron transport layer, the hole transport layer, or the light emitting layer of the first sub-pixel. The second component of the blocking member may comprise a part of a same material as that of at least one of the electron transport layer, the hole transport layer, or the light emitting layer of the second sub-pixel. For example, at least one of the electron transport layer, the hole transport layer, or the light emitting layer of the first sub-pixel may extend onto the pixel define layer, and at least one of the electron transport layer, the hole transport layer, or the light emitting layer of the second sub-pixel may also extend onto the pixel define layer. The two extended parts overlap on the pixel define layer to form an overlapping part. This overlapping part can serve as a blocking member. Of course, the scope of the embodiments of the present disclosure is not limited to the extending situation described herein. For example, in the manufacturing process, the overlapping part may be spaced apart from the corresponding sub-pixels, respectively.

In a case where the first component and the second component of the blocking member each comprises a part of a same material as that of the electron transport layer, the part of the same material as that of the electron transport layer of the first component is spaced apart from the part of the same material as that of the electron transport layer of the second component. For example, in a case where the first component comprises a part of the same material as that of the electron transport layer of the first sub-pixel and the second component comprises a part of the same material as that of the electron transport layer of the second sub-pixel, the part of the same material as that of the electron transport layer of the first sub-pixel of the first component is spaced apart from the part of the same material as that of the electron transport layer of the second sub-pixel of the second component. In this embodiment, in a direction perpendicular to a surface of the pixel define layer adjacent to the blocking member, the part of the same material as that of the electron transport layer of the first component may be spaced apart from the part of the same material as that of the electron transport layer of the second component by different structural layers, so that the electrons between different sub-pixels do not affect each other, and the accuracy of emission of sub-pixel is improved.

In a case where the first component and the second component of the blocking member each comprises a part of a same material as that of the hole transport layer, the part of the same material as that of the hole transport layer of the first component is spaced apart from the part of the same material as that of the hole transport layer of the second component. For example, in a case where the first component comprises a part of the same material as that of the hole transport layer of the first sub-pixel and the second component comprises a part of the same material as that of the hole transport layer of the second sub-pixel, the part of the same material as that of the hole transport layer of the first sub-pixel of the first component is spaced apart from the part of the same material as that of the hole transport layer of the second sub-pixel of the second component. In this embodiment, in a direction perpendicular to a surface of the pixel define layer adjacent to the blocking member, the part of the same material as that of the hole transport layer of the first component may be spaced apart from the part of the same material as that of the hole transport layer of the second component by different structural layers, so that holes between different sub-pixels do not affect each other, and the accuracy of emission of sub-pixel is improved.

Embodiments in which the overlapping part of the functional layers is used as a blocking member will be described below in detail with reference to FIGS. 2 and 3, respectively.

Figure 2:
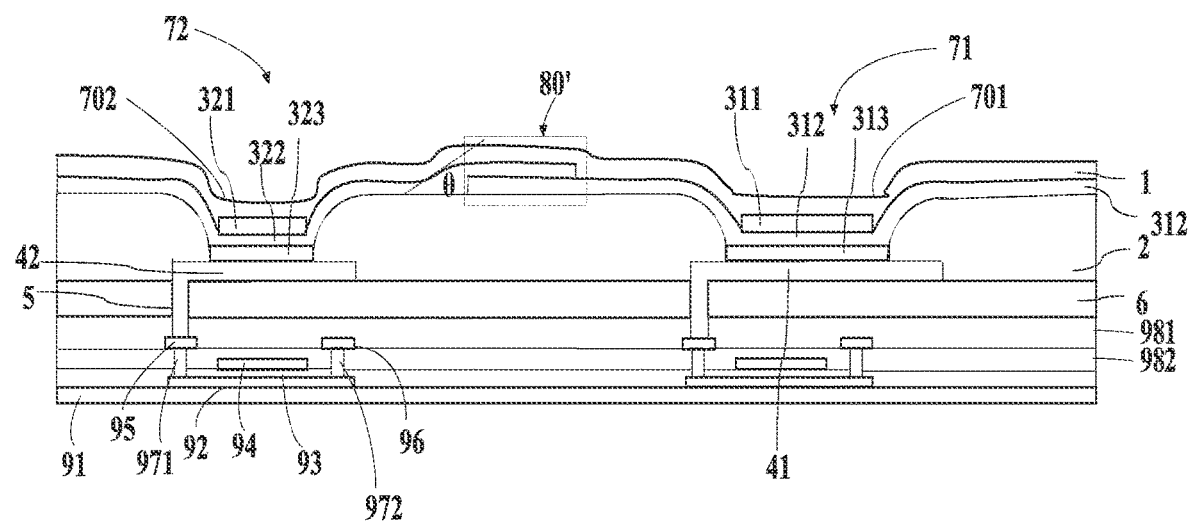
FIG. 2 is a schematic sectional view schematically showing a light emitting device according to another embodiment of the present disclosure.

FIG. 2 is a schematic sectional view schematically showing a light emitting device according to another embodiment of the present disclosure. As shown in FIG. 2, the light emitting device may comprise a pixel define layer 2, a plurality of sub-pixels, and a blocking member 80'. The plurality of sub-pixels comprise a first sub-pixel 71 and a second sub-pixel 72 spaced apart from the first sub-pixel 71 by the pixel define layer 2. Each sub-pixel may comprise a functional layer. The blocking member 80' may be disposed on the pixel define layer 2.

For example, as shown in FIG. 2, the functional layer of the first sub-pixel 71 may comprise an electron transport layer (which may be referred to as a first electron transport layer) 311, a hole transport layer (which may be referred to as a first hole transport layer) 313, and a light emitting layer (which may be referred to as a first light emitting layer) 312 between the electron transport layer 311 and the hole transport layer 313. The functional layer of the second sub-pixel 72 may comprise an electron transport layer (which may be referred to as a second electron transport layer) 321, a hole transport layer (which may be referred to as a second hole transport layer) 323, and a light emitting layer (which may be referred to as a second light emitting layer) 322 between the electron transport layer 321 and the hole transport layer 323.

In some embodiments, as shown in FIG. 2, a first component of the blocking member 80' can comprise a part of a same material as that of the light emitting layer 312 of the first sub-pixel 71. In some embodiments, as shown in FIG. 2, a second component of the blocking member 80' can comprise a part of a same material as that of the light emitting layer 322 of the second sub-pixel 72.

For example, as shown in FIG. 2, the first light emitting layer 312 and the second light emitting layer 322 may each extend onto the pixel define layer 2, respectively. Moreover, the extended parts of the two light emitting layers overlap on the pixel define layer to form an overlapping part. This overlapping part can serve as a blocking member 80'. In the blocking member 80', an extended part of the second light emitting layer 322 covers an extended part of the first light emitting layer 312. The effect of blocking light emitted by adjacent two sub-pixels that causes a mixing phenomenon can be achieved by the blocking member, and the light mixing phenomenon of the two sub-pixels can be alleviated.

In some embodiments, as shown in FIG. 2, the slope angle θ formed by the overlapping part of the blocking member 80' on the pixel define layer may range from 1°<θ<60°. In this embodiment, when two light emitting layer overlap, the light emitting layer at an upper position appears to climb on the light emitting layer at a lower position, thus a slope angle is formed. In the range of the slope angle described above, the functional layer (for example, an organic layer) and a cathode layer (described later) on the functional layer are not easily broken at the bottom corner, so that electrical properties of the light emitting device are not affected.

In some embodiments, as shown in FIG. 2, in a case where the second component (e.g., an extended part of the second light emitting layer 322) of the blocking member covers the first component (e.g., an extended part of the first light emitting layer 312) of the blocking member, the first sub-pixel 71 may be a red sub-pixel, and the second sub-pixel 72 may be a green sub-pixel or a blue sub-pixel. In other embodiments, in a case where the second component of the blocking member covers the first component of the blocking member, the first sub-pixel 71 may be a green sub-pixel and the second sub-pixel 72 can be a blue sub-pixel. Here, the red sub-pixel is a sub-pixel that can emit red light, the green sub-pixel is a sub-pixel that can emit green light, and the blue sub-pixel is a sub-pixel that can emit blue light.

In the above embodiment, at the overlapping part serving as a blocking member, the part of the same material as that of the light emitting layer of the green sub-pixel or the blue sub-pixel covers the part of the same material as that of the light emitting layer of the red sub-pixel. Alternatively, at the overlapping part, the part of the same material as that of the light emitting layer of the blue sub-pixel covers the part of the same material as that of the light emitting layer of the green sub-pixel. In such an overlapping coverage manner, thicknesses of organic layers (for example, light-emitting layers) of RGB (R represents a red sub-pixel, G represents a green sub-pixel, and B represents a blue sub-pixel) can be set to decrease gradually in the manufacturing process, so that the subsequent evaporation process has a time shorter than that of the previous evaporation process, and has less effect on the organic layer formed in the previous evaporation process.

For example, a light emitting layer of a red sub-pixel is formed first, and then a light emitting layer of a blue or green sub-pixel is formed. Since the light emitting layer of the blue or green sub-pixel is thinner than the light-emitting layer of the red sub-pixel, the time of the evaporation process required to form the light emitting layer of the blue or green sub-pixel is shorter, and the effect on the light emitting layer of the red sub-pixel that has been formed is less.

In addition, the human eye is insensitive to a blue sub-pixel. Thus, in a case where the blue light emitting layer is located at the uppermost position, blue fluorescence (even if generated) will has less effect on the visual effect of the image viewed by the human eye.

In some embodiments of the present disclosure, as shown in FIG. 2, the light emitting device may further comprise a cathode layer 1. For example, the cathode layer 1 may cover an entire area (which may be referred to as an active area) of a plurality of sub-pixels. The cathode layer 1 is located above the electron transport layer.

In some embodiments of the present disclosure, the light emitting device may further comprise a drive transistor (e.g., a TFT (Thin Film Transistor)). For example, as shown in FIG. 2, the drive transistor may comprise a semiconductor layer 92, a gate insulating layer 93, a gate electrode 94, a source electrode 95, and a drain electrode 96, or the like. The semiconductor layer 92 is on the substrate 91. For example, a buffer layer (not shown) may be disposed between the substrate 91 and the semiconductor layer 92. The gate insulating layer 93 is located between the gate electrode 94 and the semiconductor layer 92. The source electrode 95 is connected to the anode 42 (or 41) through a conductive material layer in the via 5 and to the semiconductor layer 92 through a conductive material layer in another via 971. The drain electrode 96 is connected to the semiconductor layer 92 through a conductive material layer in another via 972. In addition, the light emitting device may further comprise other insulating layers (for example, insulating layers 981 and 982) or a planarization layer, or the like.

In embodiments of the present disclosure, the sub-pixel may comprise an organic light emitting diode. The light emitting devices according to some embodiments of the present disclosure will be described below in detail from another perspective.

Embodiments of the present disclosure further provide a light emitting device. For example, as shown in FIG. 2, the light emitting device may comprise a plurality of drive transistors, a substrate 91, a plurality of organic light emitting diodes, and a blocking member 80'.

Each of the drive transistors may comprise a first electrode. For example, the first electrode can be a source electrode 95. The substrate 91 is located on one side of the plurality of drive transistors. The plurality of organic light emitting diodes are located on the other side of the plurality of drive transistors opposite to the substrate 91. Each of the organic light emitting diodes may comprise a second electrode (e.g., anode 41 or 42), a third electrode (e.g., cathode 1), and a functional layer. The second electrode is electrically connected to the first electrode (for example, the anode 41 or 42 is electrically connected to the source electrode 95). At least a part of the functional layer is located between the second electrode and the third electrode. The plurality of organic light emitting diodes comprise at least a first organic light emitting diode 701 and a second organic light emitting diode 702 adjacent to the first organic light emitting diode 701 and spaced apart from the first organic light emitting diode 701 by the pixel define layer 2. The functional layer may comprise at least a light emitting layer 312 or 322. An area of a surface of the light emitting layer away from the substrate is greater than that of a surface of the second electrode (e.g., anode 41 or 42) away from the substrate. This allows the light emitting layer to be in full contact with other functional layers such as an electron transport layer or a hole transport layer, ensuring an effective light emitting area as much as possible.

The blocking member 80' is located on a side of the pixel define layer 2 away from the substrate. A projection of the blocking member 80' on the substrate 91 is spaced apart from a projection of the second electrode (e.g., the anode 41 or 42) on the substrate 91. The blocking member 80' may comprise a part of a same material as that of the functional layer (e.g., a light emitting layer). For example, the blocking member 80' may comprise a part formed by the light emitting layers 312 and 322 extending onto the pixel define layer 2 and overlapping.

In some embodiments, as shown in FIG. 2, the drive transistor can also comprise a gate electrode 94, a drain electrode 96, and a semiconductor layer 92. The semiconductor layer 92 is located on the substrate 91. The gate electrode 94 and the semiconductor layer 92 are spaced apart by the gate insulating layer 93. The source electrode 95 is connected to the second electrode (e.g., anode 42 or 41). The source electrode 95 and the drain electrode 96 are connected to the semiconductor layer 92, respectively. A projection of the semiconductor layer 92 on the substrate 91 is within a projection of the second electrode (e.g., anode 42 or 41) on the substrate 91.

In some embodiments, as shown in FIG. 2, the functional layer may further comprise a hole transport layer 313 (or 323) and an electron transport layer 311 (or 321).

In some embodiments, the blocking member 80' may comprise a first component and a second component. A material of the first component is the same as that of at least a part of the functional layer of the first organic light emitting diode 701. A material of the second component is the same as that of at least a part of the functional layer of the second organic light emitting diode 702. For example, as shown in FIG. 2, the material of the first component of the blocking member 80' is the same as that of the light emitting layer 312 of the first organic light emitting diode 701, and the material of the second component of the blocking member 80' is the same as that of the light emitting layer 322 of the second organic light emitting diode 702. The first component and the second component are stacked on the pixel define layer.

In some embodiments, the first component may be a part of the functional layer of the first organic light emitting diode extending above the pixel define layer, and the second component may be a part of the functional layer of the second organic light emitting diode extending above the pixel define layer. For example, as shown in FIG. 2, the first component may be a part of the light emitting layer 312 of the first organic light emitting diode 701 extending above the pixel define layer 2, and the second component may be a part of the light emitting layer 322 of the second organic light emitting diode 702 extending above the pixel define layer 2.

In some embodiments, in a case where the second component covers the first component, the first organic light emitting diode 701 may be a red organic light emitting diode, and the second organic light emitting diode 702 may be a green organic light emitting diode or a blue organic light emitting diode. In other embodiments, in a case where the second component covers the first component, the first organic light emitting diode 701 may be a green organic light emitting diode, and the second organic light emitting diode 702 may be a blue organic light emitting diode.

Figure 3:
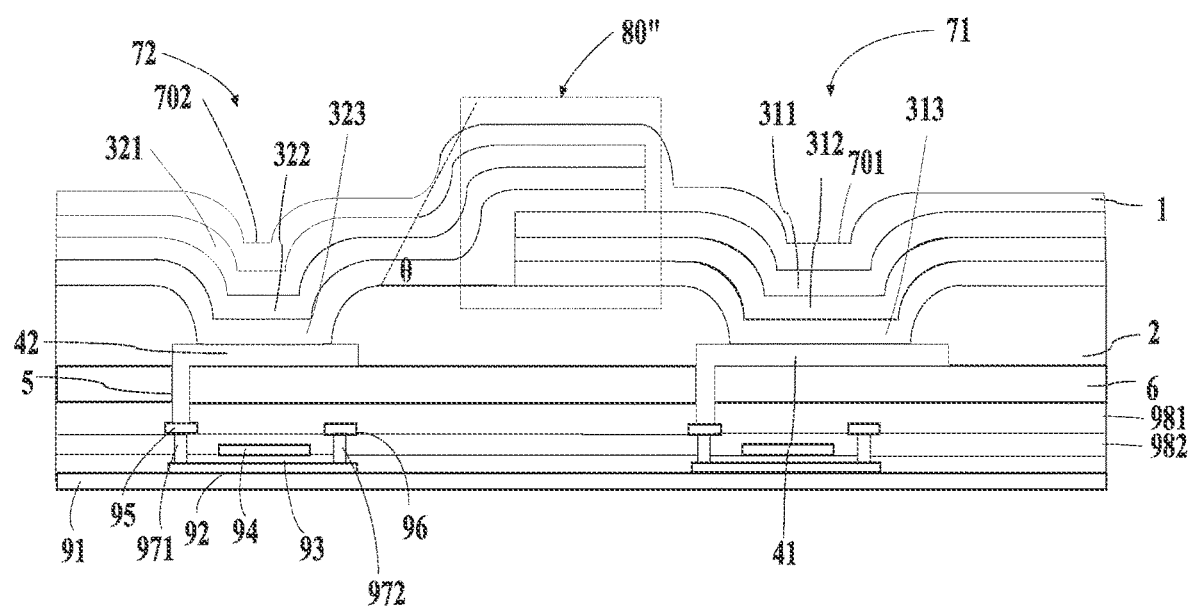
FIG. 3 is a schematic sectional view schematically showing a light emitting device according to still another embodiment of the present disclosure.

FIG. 3 is a schematic sectional view schematically showing a light emitting device according to another embodiment of the present disclosure. As shown in FIG. 3, the light emitting device may comprise a pixel define layer 2, a plurality of sub-pixels, and a blocking member 80". The plurality of sub-pixels comprise a first sub-pixel 71 and a second sub-pixel 72 spaced apart from the first sub-pixel 71 by the pixel define layer 2. Each sub-pixel may comprise a functional layer. The blocking member 80" may be disposed on the pixel define layer 2. Here, the same/similar structure (s) of the light emitting device shown in FIG. 3 as/to that of the light emitting device shown in FIG. 2 will not be described.

In some embodiments, as shown in FIG. 3, a first component of the blocking member 80" may comprise three parts of a same material as that of the first carrier transport layer (for example, the electron transport layer 311), the second carrier transport layer (for example, the hole transport layer 313), and the light emitting layer 312 of the first sub-pixel 71, respectively. In some embodiments, as shown in FIG. 3, a second component of the blocking member 80" may comprise three parts of a same material as that of the first carrier transport layer (for example, the electron transport layer 321), the second carrier transport layer (for example, the hole transport layer 323), and the light emitting layer 322 of the second sub-pixel 72, respectively.

For example, as shown in FIG. 3, the electron transport layer 311, the hole transport layer 313, and the light emitting layer 312 of the first sub-pixel 71 may extend entirely onto the pixel define layer 2. The electron transport layer 321, the hole transport layer 323, and the light emitting layer 322 of the second sub-pixel 72 may also extend entirely onto the pixel define layer 2. The extended part of the above-described respective layers of the first sub-pixel 71 and the extended part of the above-described respective layers of the second sub-pixel 72 overlap above the pixel define layer 2 to form an overlapping part. This overlapping part can serve as a blocking member 80". The effect of blocking light emitted by adjacent two sub-pixels that causes a mixing phenomenon can be achieved by the blocking member, and the light mixing phenomenon of the two sub-pixels can be alleviated.

In the blocking member 80", the extended part of the respective layers of the second sub-pixel 72 (comprising the electron transport layer 321, the hole transport layer 323, and the light emitting layer 322) entirely covers the extended part of the respective layers of the first sub-pixel 71 (comprising the electron transport layer 311, the hole transport layer 313, and the light emitting layer 312). For example, as shown in FIG. 3, in a structural layer of the overlapping part, in a direction perpendicular to an upper surface of the pixel define layer (i.e., the surface adjacent to the blocking member), the two electron transport layers 311 and 312 are spaced apart by the light emitting layer 322 and the hole transport layers 323, and the two hole transport layers 313 and 323 are spaced apart by the electron transport layer 311 and the light emitting layer 312, so that carriers between different sub-pixels do not affect each other. It should be noted that although a side surface of the hole transport layer 313 may be in contact with the hole transport layer 323, but the contact area is small and the contact resistance is large, thus holes are difficult to be transmitted between the two hole transport layers and the light emission of different sub-pixels is not substantially affected.

Compared to the structure of the light emitting device shown in FIG. 2, all the functional layers in the light emitting device shown in FIG. 3 overlap between adjacent sub-pixels, which can increase a thickness of the overlapping part, that is, the blocking member, thus the effect of blocking light mixing is improved.

In some embodiments, as shown in FIG. 3, a slope angle θ formed by the overlapping part as the blocking member 80" on the pixel define layer may range from $1°<θ<60°$.

In some embodiments, similar to the previous description, as shown in FIG. 3, in a case where the second component of the blocking member covers the first component of the blocking member, the first sub-pixel 71 may be a red sub-pixel, and the second sub-pixel 72 can be a green sub-pixel or a blue sub-pixel. In other embodiments, similar to the previous description, as shown in FIG. 3, in a case where the second component of the blocking member covers the first component of the blocking member, the first sub-pixel 71 may be a green sub-pixel, and the second sub-pixel 72 can be a blue sub-pixel. Such a design has a relatively small effect on the images viewed by the human eye.

It should be noted that FIG. 2 shows an embodiment in which light emitting layers of two sub-pixels overlap on a pixel define layer to form a blocking member, and FIG. 3 shows an embodiment in which the electron transport layers, the hole transport layers and the light emitting layers of two sub-pixels overlap on the pixel define layer to form a blocking member. It should be understood that the blocking member of the embodiments of the present disclosure is not limited to the structure mentioned in the above embodiments. For example, the blocking member may comprise a structure formed with the electron transport layer 311 and the hole transport layer 323 overlapping on the pixel define layer. For another example, the blocking member may comprise a structure formed with two light emitting layers 312 and 322, the electron transport layer 311 and the hole transport layer 323 overlapping on the pixel define layer. For another example, the blocking member may comprise a structure formed with two light emitting layers 312 and 322, the electron transport layer 321 and the hole transport layer 313 overlapping on the pixel define layer. Of course, it should be understood by those skilled in the art that the blocking member can also be a structure formed with the functional layers overlapping by other ways, which are not enumerated here.

In some embodiments, as shown in FIG. 3, an area of a surface of the hole transport layer 313 or 323 away from the drive transistor is greater than that of a surface of the second electrode (e.g., anode 41 or 42) of the organic light emitting diode 701 or 702 away from the drive transistor. In some embodiments, as shown in FIG. 3, an area of a surface of the electron transport layer 311 or 321 away from the drive transistor is greater than that of a surface of the second electrode (e.g., anode 41 or 42) of the organic light emitting diode 701 or 702 away from the drive transistor.

In some embodiments, in a case where the first sub-pixel 71 is a red sub-pixel, and the second sub-pixel 72 is a green sub-pixel (or the first organic light emitting diode 701 is a red organic light emitting diode, and the second organic light emitting diode 702 is a green organic light emitting diode), the blocking member (for example, the overlapping part shown in FIG. 2 or FIG. 3) may have a thickness ranging from 500 Å to 3500 Å. For example, the blocking member may have a thickness of 1000 Å, 2000 Å, or 3000 Å.

In other embodiments, in a case where the first sub-pixel 71 is a green sub-pixel, and the second sub-pixel 72 is a blue sub-pixel (or the first organic light emitting diode 701 is a green organic light emitting diode, and the second organic light emitting diode 702 is a blue organic light emitting diode), the blocking member (for example, the overlapping part shown in FIG. 2 or FIG. 3) may have a thickness ranging from 400 Å to 2700 Å. For example, the blocking member may have a thickness of 700 Å, 1000 Å, or 2000 Å.

In other embodiments, in a case where the first sub-pixel 71 is a red sub-pixel, and the second sub-pixel 72 is a blue sub-pixel (or the first organic light emitting diode 701 is a red organic light emitting diode, and the second organic light emitting diode 702 is a blue organic light emitting diode), the blocking member (for example, the overlapping part shown in FIG. 2 or FIG. 3) may have a thickness ranging from 400 Å to 2700 Å. For example, the blocking member may have a thickness of 700 Å, 1000 Å, or 2000 Å.

Figures 4, 5:
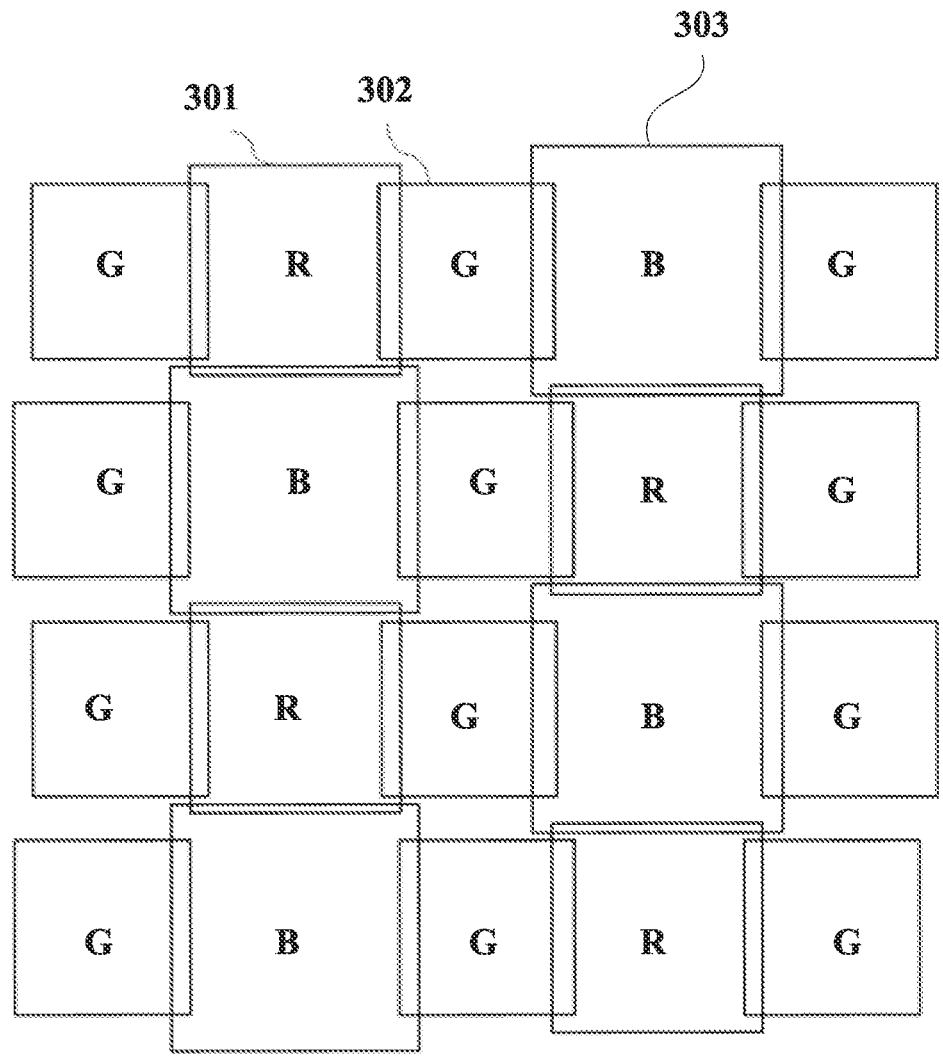
FIG. 4 is a top view schematically showing a light emitting device according to another embodiment of the present disclosure.
FIG. 5 is a flowchart illustrating a method for manufacturing a light emitting device according to an embodiment of the present disclosure.

FIG. 4 is a top view schematically showing a light emitting device according to another embodiment of the present disclosure.

As shown in FIG. 4, a first region 301 is a region of a functional layer of a red sub-pixel R and an extended part of the functional layer of the red sub-pixel R, a second region 302 is a region of a functional layer of a green sub-pixel G and an extended part of the functional layer of the green sub-pixel G, and the third region 303 is a region of a functional layer of a blue sub-pixel B and an extended part of the functional layer of the blue sub-pixel B. There are overlapping regions between adjacent sub-pixels in these sub-pixels.

In some embodiments, as shown in FIG. 4, in a plurality of sub-pixels, an area of the third region 303 is greater than that of the first region 301, and an area of the first region 301 is greater than that of the second region 302. Such a design can achieve better effect of images viewed by the human eye.

In some embodiments, one pixel may be composed of sub-pixels of three colors, namely, red sub-pixel, green sub-pixel and blue sub-pixel. One pixel may be composed of one red sub-pixel, one blue sub-pixel and two green sub-pixels. Moreover, one green sub-pixel can be common to two pixels.

In some embodiments, as shown in FIG. 4, in a plurality of sub-pixels, sub-pixels of the same row are alternately arranged in RGBG. Such an arrangement may substantially result in overlapping regions between any two adjacent sub-pixels of different colors.

In some embodiments, as shown in FIG. 4, in two adjacent columns of sub-pixels, the green sub-pixels G are arranged in one column of sub-pixels, and the red sub-pixels R and the blue sub-pixels B are alternately arranged in the other column of sub-pixels. Such a design can make the green sub-pixels G be reused in different pixels. For example, the green sub-pixels G of the first row of pixels may serve as sub-pixels of the first row of pixels when a first frame is displayed, and may also serve as sub-pixels of the second row of pixels when a second frame is displayed as frame needed. This will make the displayed image has more rounded corners and higher resolution.

Embodiments of the present disclosure also provide a display device comprising the light emitting device as described above, for example, the light emitting device as shown in FIG. 1, FIG. 2 or FIG. 3. For example, the display device may comprise a display panel, a display screen, a mobile phone, a tablet, a notebook computer, or the like.

FIG. 5 is a flowchart illustrating a method for manufacturing a light emitting device according to an embodiment of the present disclosure.

At step S520, a pixel define layer is formed on an initial substrate structure. The pixel define layer is formed with a plurality of openings exposing the initial substrate structure.

Figure 6:
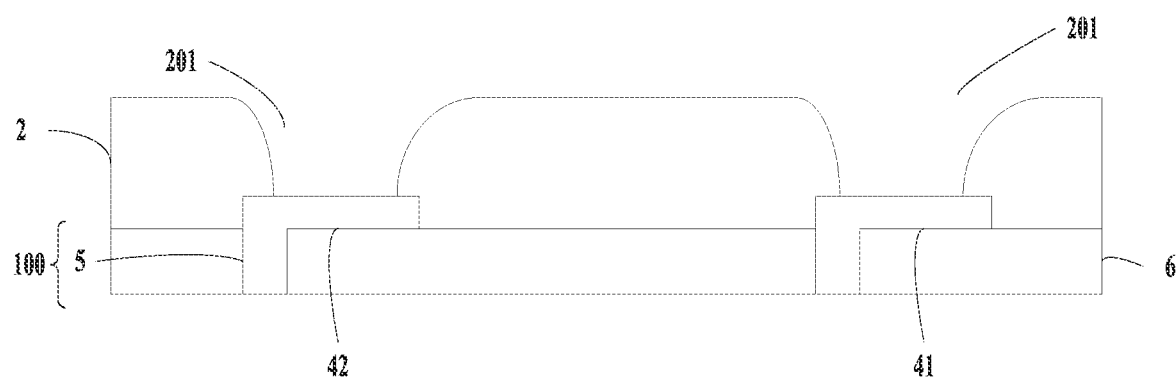
FIG. 6 is a schematic sectional view schematically showing a structure obtained at step S520 of a manufacturing process of the light emitting device in FIG. 5 according to an embodiment of the present disclosure.

FIG. 6 is a schematic sectional view schematically showing a structure obtained at step S520 of a manufacturing process of the light emitting device in FIG. 5 according to an embodiment of the present disclosure. As shown in FIG. 6, a pixel define layer 2 is formed on an initial substrate structure 100. For example, as shown in FIG. 6, the initial substrate structure 100 may comprise an anode (e.g., a first anode 41 and a second anode 42), a spacer insulating layer 6, a via 5 connected to the anode, or the like. Of course, it can be understood by those skilled in the art that the initial substrate structure 100 can also comprise other structural layers, which are not shown here.

As shown in FIG. 6, the pixel define layer 2 is formed with a plurality of openings 201 exposing the initial substrate structure 100. For example, the pixel define layer 2 can be etched to form the plurality of openings 201. For example, each opening 201 can expose an anode. For example, as shown in FIG. 6, for two adjacent openings, one opening exposes the first anode 41 and the other opening exposes the second anode 42.

Back to FIG. 5, at step S540, functional layers for a plurality of sub-pixels are formed in the plurality of openings, and a blocking member is formed on the pixel define layer.

FIG. 6 is a schematic sectional view schematically showing a structure obtained at step S540 of a manufacturing process of the light emitting device in FIG. 5 according to an embodiment of the present disclosure. As shown in FIG. 1, a functional layer of the first sub-pixel 71 is formed in one of the plurality of openings, a functional layer of the second sub-pixel 72 is formed in another adjacent one of the plurality of openings, and a blocking member 80 is formed on the pixel define layer 2.

In some embodiments, a material of the blocking member is different from that of the sub-pixel. For example, the blocking member may comprise an insulating layer, and the sub-pixel may comprise a functional layer (e.g., an organic layer). In such a case, a functional layer and a blocking member of a sub-pixel can be formed separately. For example, functional layers for a plurality of sub-pixels may be formed in a plurality of openings first, and then a blocking member may be formed on the pixel define layer. For another example, a blocking member may be formed on the pixel define layer first and then functional layers for a plurality of sub-pixels may be formed in a plurality of openings.

In other embodiments, a material of the blocking member may be the same as that of at least a part of the functional layers of the plurality of sub-pixels. In such a case, a blocking member may be formed in the process of forming functional layers of the plurality of sub-pixels. For example, a part of the functional layers may also be formed on the pixel define layer in the process of forming a part of the functional layers of the first sub-pixel and the second sub-pixel. A blocking member can be formed with these functional layers overlapping on the pixel define layer.

In some embodiments, a functional layer of the sub-pixel may comprise an electron transport layer, a hole transport layer, and a light-emitting layer. For example, in the process of forming the light emitting layer of the first sub-pixel and a light emitting layer of the second sub-pixel, a part of a light emitting layer of the first sub-pixel can be overlaid on the pixel define layer by an evaporation or printing process, and then a part of the light emitting layer of the second sub-pixel can be overlaid on the part of the light-emitting layer of the first sub-pixel located on the pixel define layer (refer to FIG. 2) by an evaporation or printing process. Thus, a blocking member is formed with light emitting layers of adjacent sub-pixels overlapping on the pixel define layer.

Heretofore, a method of manufacturing a light emitting device according to some embodiments of the present disclosure has been provided. In the manufacturing method, a blocking member is formed on the pixel define layer. The blocking member can block light emitted by the first sub-pixel and the second sub-pixel from being respectively above the pixel define layer to cause a light mixing phenomenon as much as possible. Thereby, the light mixing phenomenon between adjacent first sub-pixel and second sub-pixel can be alleviated, and the display effect of the light emitting device can be improved.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A light emitting device, comprising:
a plurality of drive transistors, each of the plurality of drive transistors comprising a first electrode;
a substrate located on one side of the plurality of drive transistors;
a plurality of organic light emitting diodes located on the other side of the plurality of drive transistors opposite to the substrate, comprising at least a first organic light emitting diode and a second organic light emitting diode adjacent to and spaced apart from the first organic light emitting diode by a pixel define layer, wherein:
each of the plurality of organic light emitting diodes comprises a second electrode electrically connected to the first electrode, a third electrode, and a functional layer at least a part of which being located between the second electrode and the third electrode, and
the functional layer comprises at least a light emitting layer, an area of a surface of the light emitting layer of the first organic light emitting diode away from the substrate is greater than an area of a surface of the second electrode of the first organic light emitting diode away from the substrate, and an area of a surface of the light emitting layer of the second organic light emitting diode away from the substrate is greater than an area of a surface of the second electrode of the second organic light emitting diode away from the substrate; and
a blocking member located on a side of the pixel define layer away from the substrate, wherein a projection of the blocking member on the substrate is spaced apart from a projection of the second electrode on the substrate, and the blocking member comprises a part of a same material as that of the functional layer, the blocking member comprises a first component and a second component stacked on the pixel define layer, wherein a material of the first component is the same as that of at least a part of the functional layer of the first organic light emitting diode, and a material of the second component is the same as that of at least a part of the functional layer of the second organic light emitting diode, the first component is a part of the functional layer of the first organic light emitting diode extending above the pixel define layer, and the second component is a part of the functional layer of the second organic light emitting diode extending above the pixel define layer,
wherein in the plurality of organic light emitting diodes:

a sum of areas of the functional layer of a blue organic light emitting diode and a part of the functional layer of the blue organic light emitting diode extending above the pixel define layer is greater than a sum of areas of the functional layer of a red organic light emitting diode and a part of the functional layer of the red organic light emitting diode extending above the pixel define layer in a case where the first organic light emitting diode is the red organic light emitting diode and the second organic light emitting diode is the blue organic light emitting diode, and a sum of areas of the functional layer of a red organic light emitting diode and a part of the functional layer of the red organic light emitting diode extending above the pixel define layer is greater than a sum of areas of the functional layer of a green organic light emitting diode and a part of the functional layer of the green organic light emitting diode extending above the pixel define layer in a case where the first organic light emitting diode is the red organic light emitting diode and the second organic light emitting diode is the green organic light emitting diode.

2. The light emitting device according to claim 1, wherein:
the first electrode is a source electrode; and
each of the plurality of drive transistors further comprises a gate electrode, a drain electrode, and a semiconductor layer, wherein a projection of the semiconductor layer on the substrate is located within a projection of the second electrode on the substrate.

3. The light emitting device according to claim 1, wherein the functional layer further comprises a hole transport layer and an electron transport layer, wherein an area of a surface of the hole transport layer away from the substrate and an area of a surface of the electron transport layer away from the substrate each is greater than that of a surface of the second electrode away from the substrate.

4. The light emitting device according to claim 1, wherein a slope angle $\theta$ formed by the blocking member on the pixel define layer ranges from $1°<\theta<60°$.

5. The light emitting device according to claim 1, wherein in a case where the second component covers the first component:
the first organic light emitting diode is a red organic light emitting diode, and the second organic light emitting diode is a green organic light emitting diode or a blue organic light emitting diode; or
the first organic light emitting diode is a green organic light emitting diode, and the second organic light emitting diode is a blue organic light emitting diode.

6. A display device, comprising the light emitting device according to claim 1.

* * * * *